United States Patent [19]

Groeneweg et al.

[11] Patent Number: 4,634,940
[45] Date of Patent: Jan. 6, 1987

[54] SINE WAVE DEFLECTION CIRCUIT FOR BIDIRECTIONAL SCANNING OF A CATHODE RAY TUBE

[75] Inventors: Willem H. Groeneweg, Affoltern am Albis; Juergen F. Hemme, Meilen, both of Switzerland

[73] Assignee: RCA Corporation, Princeton, N.J.

[21] Appl. No.: 594,823

[22] Filed: Mar. 29, 1984

[51] Int. Cl.[4] .............................................. H01J 29/76
[52] U.S. Cl. .................................................... 315/408
[58] Field of Search ......................... 315/408, 378, 27; 328/27

[56] References Cited

U.S. PATENT DOCUMENTS

| | | |
|---|---|---|
| 3,026,486 | 3/1962 | Pintell . |
| 3,209,231 | 9/1965 | Pintell . |
| 3,247,468 | 4/1966 | Pintell .................................... 328/27 |
| 3,809,947 | 5/1974 | Ambrico et al. . |

FOREIGN PATENT DOCUMENTS 80303881.9 10/1980 European Pat. Off. .

OTHER PUBLICATIONS

IBM Technical Disclosure Bulletin, vol. 14, No. 4, dated Sep. 1971, entitled Amplitude Regulation of a Sine-Wave Deflection System by Pulse Width Modulation, by S. G. Katsafouros.
IBM Technical Disclosure Bulletin vol. 21 No. 12, dated May 1979, entitled Bidirectional Scan for CRT by A. S. Murphy.

Primary Examiner—Theodore M. Blum
Assistant Examiner—David Cain
Attorney, Agent, or Firm—Eugene M. Whitacre; Joseph J. Laks; Sammy S. Henig

[57] ABSTRACT

A capacitively coupled square wave generator provides a steady state sinusoidal current flow in a deflection winding of a cathode ray tube. The deflection winding, the capacitive coupling and an additional capacitor form a tank circuit which filters out the odd harmonics of the square wave generator to provide a sinusoidal current in the deflection winding to produce bidirectional scanning.

19 Claims, 8 Drawing Figures

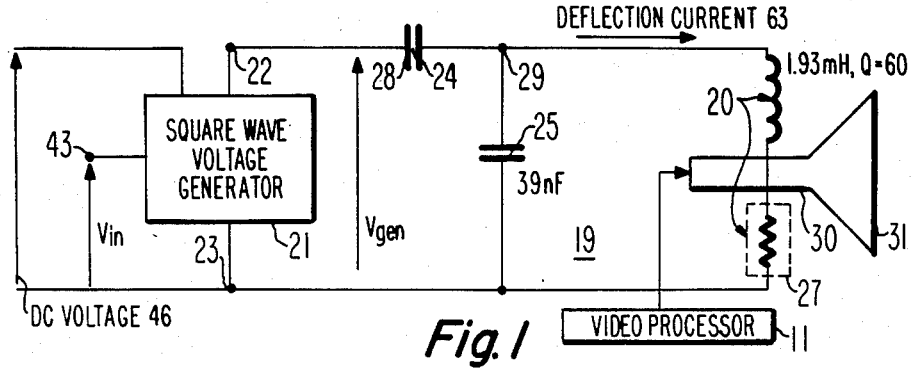
Fig. 1
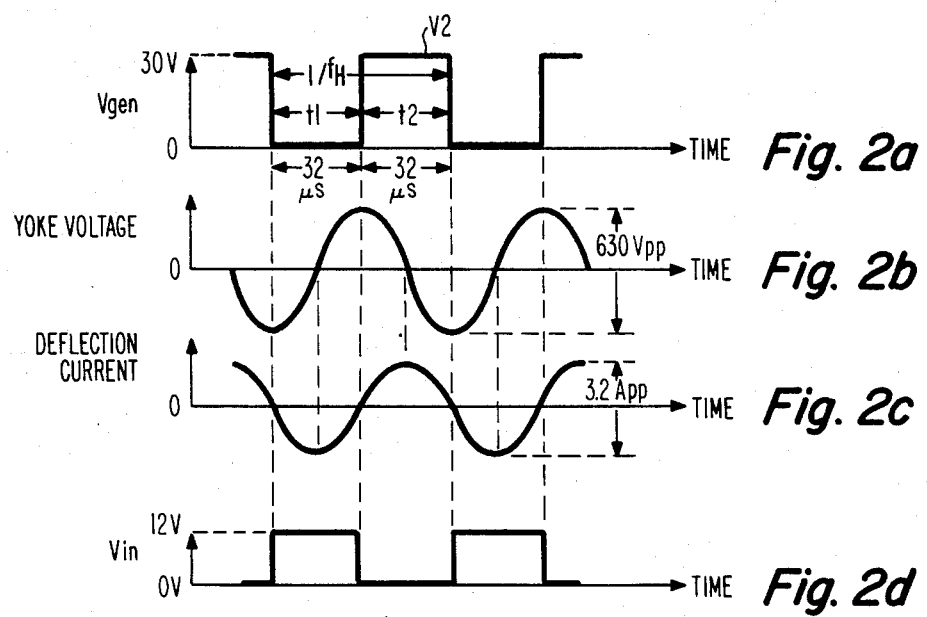
Fig. 2a
Fig. 2b
Fig. 2c
Fig. 2d
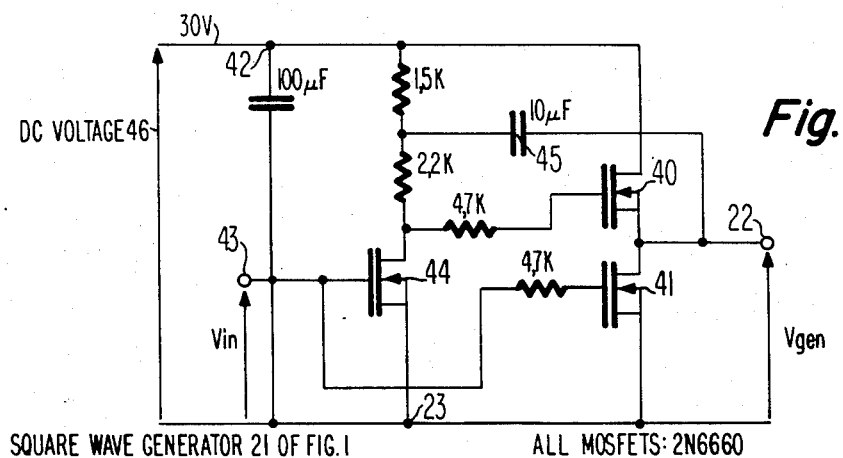
Fig. 3
SQUARE WAVE GENERATOR 21 OF FIG.1    ALL MOSFETS: 2N6660

SINE WAVE DEFLECTION CIRCUIT FOR BIDIRECTIONAL SCANNING OF A CATHODE RAY TUBE

BACKGROUND OF THE INVENTION

This invention relates to circuits for providing electromagnetic deflection of an electron-beam, and in particular, to circuits in which steady state sinusoidal current is employed to cause a zig-zag deflection.

A sinusoidal current for driving a horizontal deflection winding has been proposed. One advantage of using a sinusoidal current rather than the conventional ramp current lies in the fact that a lower power dissipation is achieved by a deflection circuit utilizing the sinusoidal current drive than in a comparable fast flyback type. This is so because in a system using sinusoidal deflection, the current flowing through the winding is primarily of the fundamental frequency of the driving current; whereas in a fast flyback the harmonics contents are higher, and the higher the harmonics contents of the deflection current, the higher the power dissipated in the ferrite of the winding and the losses due to the skin effect.

One feature of the invention is obtaining a sinusoidal-like current for driving deflection circuits of a picture tube by using a capacitively coupled symmetrical square wave voltage generator. The winding current provided by this square wave generator circuit may be characterized, however, as being a generally sinusoidal-periodic current having a period including the forward and return sweep durations in that the current in the fundamental, or first order frequency, is substantially stronger than the current in the harmonics. In some prior art circuitry the excitation voltage of the deflection circuit is not a capacitively coupled symmetrical square wave voltage generator, but a sine-wave generator providing a sine-wave voltage at its output stage. The output stage in the prior art operates as a linear amplifier; therefore, it requires more complicated circuit elements and it is less efficient for delivering power than the power stage in the square wave voltage generator of the invention which operates in switching mode. When a switch is closed, a DC voltage provided to the output stage is delivered to a load. This causes a small voltage drop on the switch impedance. Therefore, the power dissipated is small. Because the transition times are short in relation to the entire period of the square wave cycle, the energy dissipated during the transition time is small. In contrast, the output stage of a linear amplifier dissipates power during most of the cycle; therefore, its efficiency is lower than that of the output stage of the circuit of the invention.

In other prior art circuits, a pulse of current is provided during a short portion of the deflection cycle to a tank circuit which includes the inductance of the windings. The shortness of the pulse of current tends to result in undue stresses in the circuit components. In contrast, in the circuit of the invention, the energy is delivered during the entire cycle. The short pulse current of the prior art is required to deliver high power during the short period it is provided. This creates higher harmonic content in the sinusoidal-like current in the winding than in the sinusoidal-like current of the circuit of the invention.

Another feature of the invention is that it is possible to select the voltage of the generator from a wide range of voltages to achieve a predetermined amplitude of the sinusoidal current by selecting the relative capacitance of certain capacitors of the circuit.

Yet another aspect of the invention is the incorporation of a feedback loop circuit that reduces the dependency of the deflection current amplitude on circuit parameters.

SUMMARY OF THE INVENTION

An apparatus for generating a generally sinusoidal periodic current in a deflection winding of a cathode ray tube includes a square wave voltage generator. A resonant circuit that includes the inductance of the deflection winding is coupled to two terminals of the square wave voltage generator so that a sinusoidal periodic current is excited in the deflection winding. The sinusoidal periodic current causes the electron beam in the cathode ray tube to cyclically move away from one side of the screen of the cathode ray tube and return.

BRIEF DESCRIPTION OF THE DRAWINGS

FIG. 1 illustrates a bidirectional scanning circuit embodying one aspect of the invention;

FIGS. 2a-2d illustrate waveforms useful in explaining the operation of the circuit of FIG. 1;

FIG. 3 illustrates a detailed embodiment of the generator of FIG. 1 in accordance with an aspect of the invention;

DETAILED DESCRIPTION OF THE INVENTION

Figure 4:
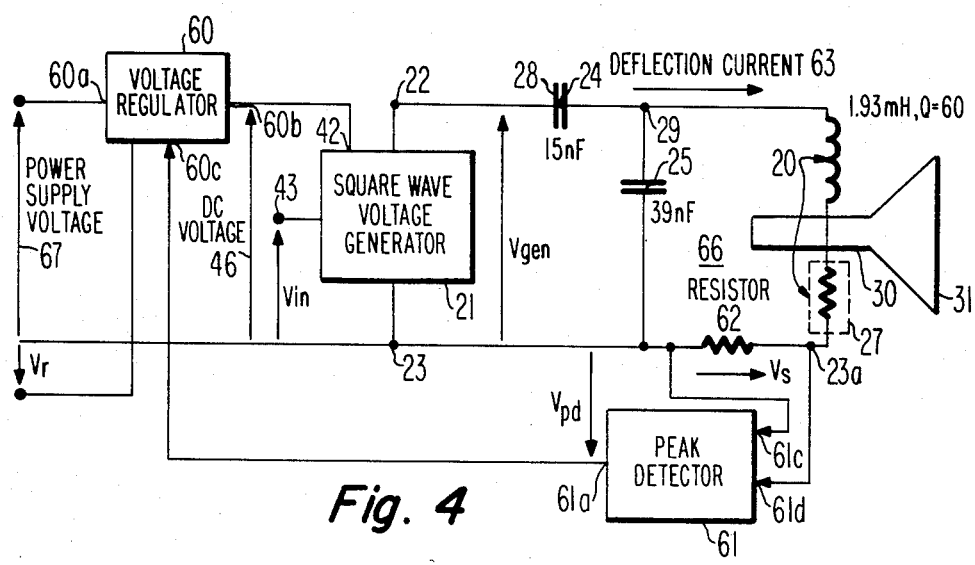
FIG. 4 illustrates a bidirectional scanning circuit, embodying another aspect of the invention, having a negative feedback loop for making the deflection current less dependent on the parameters of the circuit.

The bidirectional scanning circuit 19, illustrated in FIG. 1, which embodies one aspect of the invention, provides a sinusoidal-like periodic current, deflection current 63, through a deflection winding 20. Deflection winding 20 is used for directing the electron-beam in a cathode ray tube 30 to cyclically move away from one side of a screen 31 of the tube and back to the same side. Such a deflection circuit may be used in order to effectuate a horizontal scanning.

Scanning circuit 19 includes a square wave generator 21 which provides a square wave voltage Vgen between a terminal 22 and a terminal 23. FIG. 2a illustrates a timing diagram of the voltage Vgen developed by generator 21. The voltage Vgen comprises a square wave voltage having a lower voltage V1 and an upper voltage level V2. Voltage level V1 is maintained during the interval t1 and voltage level V2 is maintained during the interval t2. The value V1−V2 defines the amplitude of the square wave voltage, and the time t1+t2 defines the period. In the circuit of FIG. 1, the period is chosen to be equal to the duration of the forward sweep plus the return sweep of the electron beam. In the preferred embodiment of FIG. 1, the generator provides a symmetrical square wave voltage where t1 equals t2. However, a slightly distorted symmetrical square wave voltage may not substantially diminish the quality of the sinusoidal-like current in deflection winding 20. Terminal 22 is coupled to one plate 28 of a capacitor 24. The other plate of capacitor 24 is coupled to one end of deflection winding 20 at a terminal 29. A lead of capacitor 25 is coupled to terminal 29. The other lead of capacitor 25 and the other end of deflection winding 20 are coupled to terminal 23 of generator 21. Capacitor 24 prevents DC current from flowing in deflection winding 20. Although capacitor 24 provides coupling between generator 21 and deflection windings 20 of FIG. 1, other passive networks may suitably accomplish such coupling. Capacitor 24, capacitor 25 and winding 20 form a tank circuit in which winding 20 provides the inductance.

Because generator 21 provides a periodic voltage, the current flowing through winding 20, deflection current 63 of FIG. 1, may be analyzed as having a fundamental frequency $f_h$, which is equal to the fundamental frequency of the voltage of generator 21, and the harmonics, or multiples, of this frequency. Such frequency analysis may be proven by the well-known Fourier series analysis.

Harmonics may be introduced by various sources. One example of such source is the non-linearity of winding 20 caused by variations of the inductance of the deflection winding as a function of deflection current 63. However, the major source of harmonics in this circuit is the frequency contents of the square wave voltage. A symmetrical square wave includes, according to Fourier series of periodic functions, the fundamental frequency and its odd harmonics only. The lower the frequency of the harmonic, the stronger is its voltage in relation to the fundamental frequency. For example, the third harmonic of such square wave has an amplitude of one-third relative to that in the fundamental frequency; whereas, the fifth harmonic has an amplitude of one-fifth relative to that in the fundamental frequency.

According to the invention, symmetrical square wave voltage is preferable to non-symmetrical because a symmetrical square wave voltage doesn't include the second harmonic. The second harmonic, being close in frequency to the fundamental frequency, is more difficult to filter out.

The circuit is tuned to act as a pass filter for deflection current 63 in the fundamental frequency $f_h$. Tuning is accomplished by selecting the values of capacitor 24 and 25 so as to reduce the ratio between the amplitude of the current in the harmonics and that in the fundamental frequency. Such tuned tank circuit may be considered as being in resonance at the fundamental frequency.

By selecting the appropriate relation of the capacitance of capacitor 24 to that of capacitor 25, it is possible to obtain the desired amplitude of deflection current 63 for a given square wave voltage. The proper relation may be calculated or found empirically by varying the ratio of the capacitance of capacitor 24 to that of capacitor 25 while maintaining the total sum of the capacitance of both.

In scanning circuit 19 of FIG. 1, deflection current 63 is 3.2 amperes peak-to-peak for square wave voltage of 30 volts at the deflection cycle frequency $f_h = 15,625$ Hz. In FIG. 1, the capacitance of capacitor 24 and capacitor 25 is 15 nanoFarad and 39 manoFarad, respectively. The inductance of winding 20 is 1.93 milliHenry and the Q coefficient of the winding at 15,625 Hz is 60.

The Q coefficient is dependent on $f_h$, the inductance of the winding and a resistance 27 of the deflection winding. FIG. 2b illustrates the voltage across deflection winding 20 of FIG. 1 for Vgen=30 volts when the resonance frequency of the tank circuit equals $f_h$; the simultaneous deflection current 63 is illustrated in FIG. 2c. The voltage across deflection winding 20 and deflection current 63 are at the fundamental frequencies of the square wave voltage generator. One half of the cycle of deflection current 63 effectuates the forward sweep lasting 32 microseconds, as illustrated in FIG. 2c, and the other half of the cycle effectuates the return sweep also lasting 32 microseconds.

A video signal may be displayed during the forward sweep and during the return sweep to provide a bidirectionally scanned image. The video signal may be generated in a conventional manner by a video processor 11 of FIG. 1. The video signal may be divided into a sequence of video samples that are stored in a first in-first out memory (FIFO) for a subsequent display during the forward sweep, and in a last in-first out memory (LIFO) for a subsequent display during the return sweep.

If some overscan is available, the sinusoidal deflection current comes near to the ideal S-shape waveform. This means that shading due to non-uniform scan speed and linearity errors with a sinusoidal deflection current are less severe than in the conventional scanning system uncorrected for such errors.

FIG. 3 illustrates an embodiment of generator 21. In FIG. 3, a pair of MOS semiconductor switches of the same type, switches 40 and 41 are coupled together in a manner provided for a final push-pull power stage between terminal 22 and terminal 23. Similar identifications in FIGS. 1 and 3 signify similar functions or quantities.

The pair of semiconductors receives a DC voltage 46 of illustratively 30 volts, between a terminal 42 and terminal 23. A square-wave voltage, Vin, of illustratively 12 volts amplitude, illustrated in FIG. 2d, is provided between a terminal 43 and terminal 23 of FIG. 3. A semiconductor 44 receives Vin voltage and provides, along with the drive provided by a bootstrap capacitor 45, a drive input to switch 40. Vin is also coupled to provide a drive input to switch 41 such that when switch 41 is turned on, switch 40 is turned off and vice versa. Thus, switch 40 provides Vgen=30 volts during one half of the cycle and switch 41 provides Vgen=0 volts during the other half of the cycle. The circuit illustrated in FIG. 3 provides a low output impedance during interval t1 and t2 of FIG. 2a. Because semiconductors 40 and 41 operate in switching mode, the transition time between the time the voltage Vgen is at the V2 level of 30 volts, to the time it is at the V1 level of zero volts, and vice versa, is short in relation to the period of the square-wave. Therefore, the energy dissipated in semiconductors 41 and 40 is small. The pair of semiconductors may be of the power MOS type or of the bipolar type in a somewhat modified configuration. MOS provides small and symmetrical switching delays so that the symmetry of the square wave is maintained. As explained before, a symmetrical square-wave voltage does not introduce even harmonics to the deflection current; therefore, it is preferable.

When the generator of FIG. 3 provides a square-wave voltage output to circuit 19 of FIG. 1, the total power consumption is approximately 4 watts, of which the deflection windings take 3.5 watts at 3.2 amperes peak-to-peak current. The yoke voltage at 3.2 amperes peak-to-peak deflection current 63 is 630 voltls peak-to-peak. The DC current flowing between terminals 42 and 23 is 0.13 amperes. The total harmonics distortion of the deflection current 63 is about 0.25%.

FIG. 4 illustrates a scanning circuit 66 embodying one aspect of the invention. Circuit 66 includes generator 21, capacitors 24 and 25 and deflection winding 20, coupled as in scanning circuit 19 of FIG. 1, where one end of deflection winding 20 of circuit 66 of FIG. 4, at a node 23a, is coupled to terminal 23 of generator 21 through a resistor 62. The schematic diagram of generator 21 of FIG. 4 is illustrated in detail in FIG. 3. Identical numbers in FIGS. 3, 4 and 1 indicate similar items or functions.

In scanning circuit 66 of FIG. 4, variations of the peak current of deflection current 63 resulting from different parameter values such as the Q of deflection winding 20, are reduced, as explained in more detail below. In circuit 66 of FIG. 4, an output terminal 60b of a voltage regulator 60 is coupled to terminal 42 of generator 21 for supplying DC voltage 46. An input terminal 60a of voltage regulator 60 receives power supply voltage 67 of, illustratively, a higher value than that of DC voltage 46. A sense input terminal 60c of voltage regulator 60 is coupled to an output terminal 61a of a conventional peak detector 61 for receiving a voltage $V_{pd}$ of detector 61 that is developed between terminals 61a and 23. When $V_{pd}$ exceeds a predetermined voltage Vr that is supplied to regulator 60, DC voltage 46 decreases. On the other hand, when $V_{pd}$ is lower than the predetermined voltage Vr, DC voltage 46 increases. Input terminals 61c and d of detector 61 are coupled across resistor 62 between terminals 23 and 23a, respectively. Deflection current 63 through resistor 62 develops a voltage Vs between terminals 61c and d. The value of voltage $V_{pd}$ is directly related to the peak voltage of voltage Vs. Thus, voltage $V_{pd}$ is indicative of the peak current of current 63. Assume that the peak current of deflection current 63 is such that $V_{pd}$ is greater than Vr. Regulator 60 responds by decreasing the amplitude of DC voltage 46. A decrease in the amplitude of DC voltage 46 causes Vgen to decrease and, therefore, causes the peak current of deflection current 63 to decrease. Thus, the negative feedback loop causes the peak current of deflection current 63 to be such that $V_{pd}=Vr$. The negative feedback loop similarly corrects a decrease in the peak current of deflection current 63 that would have otherwise caused $V_{pd}$ to be lower than Vr.

Figure 5:
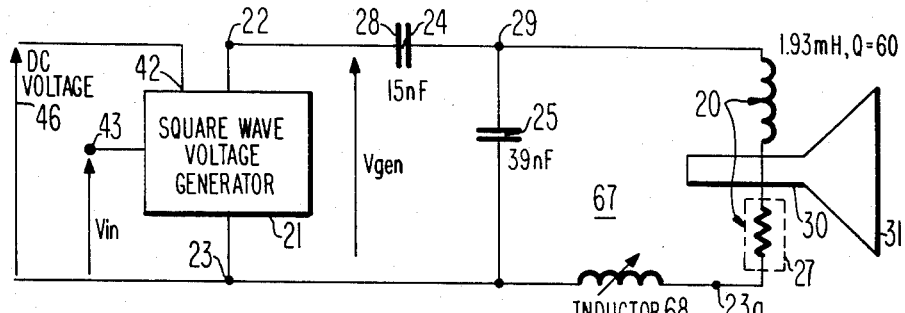
FIG. 5 illustrates a bidirectional scanning circuit, embodying yet another aspect of the invention, having a variable inductor for tuning the circuit.

FIG. 5 illustrates a scanning circuit 67 embodying another aspect of the invention. Circuit 67 includes generator 21, capacitors 24 and 25, and deflection winding 20 coupled as in scanning circuit 19 of FIG. 1, where one end of deflection winding 20 of circuit 67 of FIG. 5, at a node 23a, is coupled to terminal 23 of generator 21 through an inductor 68. Identical numbers and symbols in FIGS. 1 and 5 indicate similar functions or items. Inductor 68 of circuit 67 enables the tuning of the resonance frequency of the tank circuit to be equal to the frequency $f_h$ for any value of the inductance of deflection winding 20 within the tolerance range of deflection winding 20. When the tank circuit is tuned, the amplitude of the harmonics of deflection current 63 are reduced relative to that in the fundamental frequency $f_h$.

What is claimed is:

1. An apparatus for generating a generally sinusoidal periodic scanning current in a deflection winding of a cathode ray tube, comprising:
    a voltage generator for generating a periodic square wave voltage;
    a first circuit branch that includes a first capacitance;
    a second circuit branch that includes said deflection winding; and
    a third circuit branch that includes a second capacitance coupled in series with said square wave voltage, said third circuit branch forming with said first and second circuit branches three separate branches of a parallel resonant circuit that is driven by said voltage generator and that filters out from said scanning current a current at a harmonic thereof such that the inductance of said resonant circuit that significantly determines a ratio between the amplitudes of said harmonic and scanning currents is mainly provided by said deflection winding.

2. An apparatus as recited in claim 1 wherein said second capacitor is coupled to a first terminal of said generator for blocking the flow of DC current in said deflection winding from said generator.

3. An apparatus as recited in claim 2 wherein said first capacitor is coupled to a second terminal of said generator and to the plate of said second capacitor that is remote from said first terminal.

4. An apparatus as recited in claim 1 wherein said resonant circuit is tuned to resonate at the fundamental frequency of said square wave voltage.

5. The apparatus as recited in claim 1, wherein said square wave voltage is symmetrical.

6. The apparatus as recited in claim 1 wherein said generator comprises, a pair of semiconductor devices coupled in a push-pull configuration for providing said square wave voltage between first and second terminals of said generator.

7. The apparatus as recited in claim 6, wherein said pair of semiconductor devices are of the MOS transistors type.

8. An apparatus as recited in claim 1 further comprising, a negative feedback loop responsive to amplitude variations of said periodic scanning current for maintaining said periodic scanning current at a predetermined amplitude by controlling the amplitude of said square wave voltage.

9. An apparatus as recited in claim 8 wherein said negative feedback loop includes means for generating a first signal indicative of the amplitude of said periodic scanning current and means responsive to said first signal and coupled to said generator for regulating the amplitude of said square wave voltage.

10. An apparatus as recited in claim 9 wherein said first signal generating means comprises a resistor coupled in series with said deflection winding for developing a voltage relative to the amplitude of said periodic scanning current in said deflection winding, and a voltage peak detector coupled to said resistor for generating said first signal.

11. An apparatus as recited in claim 1 wherein said resonant circuit comprises an inductor coupled in series with said deflection winding that is capable of tuning said resonant circuit to be in resonance at a predetermined frequency.

12. An apparatus as recited in claim 11 wherein said inductor is variable.

13. An apparatus as recited in claim 1 wherein said second capacitor has one plate that is coupled to a first terminal of said generator and said first capacitor is coupled between a second terminal of said generator and the other plate of said second capacitor.

14. An apparatus as recited in claim 13 wherein said deflection winding is coupled between the junction of said first and second capacitors and said second terminal of said generator.

15. An apparatus for generating a generally sinusoidal periodic scanning current in a deflection winding of a cathode ray tube, comprising:
   a voltage generator having an output stage with first and second terminals for generating a periodic square wave voltage therebetween;
   a deflection winding;
   a passive network coupled between said first and second terminals of said generator and between respective terminals of said deflection winding for exciting in said deflection winding said periodic current in the fundamental frequency of said periodic square wave voltage while filtering out the harmonics that are included in said square wave voltage; and
   a negative feedback loop responsive to amplitude variations of said periodic scanning current for maintaining said periodic scanning current at a predetermined amplitude by controlling the amplitude of said square wave voltage.

16. An apparatus according to claim 15 wherein said passive network and said deflection winding form branches of a resonant circuit that filters out from said scanning current a current at a harmonic thereof such that the inductance of said resonant circuit that determines a ratio between the amplitudes of said harmonic and scanning currents is mainly provided by said deflection winding.

17. An apparatus according to claim 16 wherein said deflection winding exhibits a high Q inductance for providing a high Q resonant circuit that is tuned to the frequency of said square wave voltage, and wherein said negative feedback loop is responsive to said amplitude variations that are produced by corresponding variations in, or by the tolerance of, said high Q inductance of said deflection winding.

18. An apparatus according to claim 1 wherein each reactive impedance that is included in said first and third circuit branches and that affects the resonance frequency of said resonant circuit is substantially capacitive, wherein the capacitance ratio between said first and second capacitances is selected in accordance with the ratio between the amplitude of said scanning current that is required and the amplitude of said square wave voltage that is given and wherein the sum of said first and second capacitances is selected, in accordance with the frequency of said scanning current, so as to tune said resonant circuit substantially to resonance at the frequency of said scanning current such that said amplitude ratio between said harmonic and scanning currents becomes substantially small.

19. An apparatus for generating a generally sinusoidal periodic scanning current in a deflection winding of a cathode ray tube, comprising:
   a voltage generator for generating a periodic square wave voltage;
   a first circuit branch that includes a first capacitance;
   a second circuit branch that includes said deflection winding; and
   a third circuit branch that includes a second capacitance coupled in series with said square wave voltage, said third circuit branch forming with said first and second circuit branches three separate branches of a parallel resonant circuit that is driven by said voltage generator and that filters out from said scanning current a current at a harmonic thereof, wherein the capacitance ratio between said first and second capacitances is selected in accordance with the ratio between the amplitude of said scanning current that is required and the amplitude of said square wave voltage that is given and wherein the sum of said first and second capacitances is selected, in accordance with the frequency of said scanning current, so as to tune said resonant circuit substantially to resonance at the frequency of said scanning current such that said amplitude ratio between said harmonic and scanning currents becomes substantially small.

* * * * *